United States Patent
Gravermann et al.

(10) Patent No.: US 9,739,805 B2
(45) Date of Patent: *Aug. 22, 2017

(54) CONDUCTOR ASSEMBLY

(71) Applicant: 3M INNOVATIVE PROPERTIES COMPANY, St. Paul, MN (US)

(72) Inventors: Mark Gravermann, Erkelenz (DE); Friedrich A. Busemann, Amelinghausen (DE); Gerhard Lohmeier, Cologne (DE); Jens Weichold, Erkelenz (DE); Bernd Schubert, Cologne (DE); Michael H. Stalder, Jedem (DE); Pasquale Zanoli, Villa Cortese (IT); Giuliano Bolcato, Dugnano (IT)

(73) Assignee: 3M Innovative Properties Company, St. Paul, MN (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/897,688

(22) PCT Filed: Jun. 19, 2014

(86) PCT No.: PCT/US2014/043126
§ 371 (c)(1),
(2) Date: Dec. 11, 2015

(87) PCT Pub. No.: WO2014/209738
PCT Pub. Date: Dec. 31, 2014

(65) Prior Publication Data
US 2016/0139181 A1 May 19, 2016

(30) Foreign Application Priority Data

Jun. 25, 2013 (EP) .................................... 13173547

(51) Int. Cl.
*G01R 15/16* (2006.01)
*G01R 19/00* (2006.01)
(Continued)

(52) U.S. Cl.
CPC ......... *G01R 15/16* (2013.01); *G01R 19/0084* (2013.01); *G01R 27/2605* (2013.01);
(Continued)

(58) Field of Classification Search
CPC ...... G01R 31/02; G01R 31/08; G01R 31/081; G01R 31/083; G01R 31/085;
(Continued)

(56) References Cited

U.S. PATENT DOCUMENTS

| 4,052,665 A | 10/1977 | Gruenwald |
| 5,051,733 A | 9/1991 | Neuhouser |

(Continued)

FOREIGN PATENT DOCUMENTS

| DE | 3702735 | 8/1988 |
| DE | 4125856 | 9/1992 |

(Continued)

OTHER PUBLICATIONS

Datasheet, "Scotch® Electrical Semi-Conducting Tape 13", Sep. 2012, 4 pages. XP002716558.

(Continued)

*Primary Examiner* — Hoai-An D Nguyen
(74) *Attorney, Agent, or Firm* — Gregg H. Rosenblatt

(57) ABSTRACT

A conductor assembly for a power network includes an inner conductor defining radial and axial directions, an insulating layer arranged around at least an axial section of the inner conductor, and a sensing electrode arranged radially outward of the insulating layer. The sensing electrode is operable as a first electrode of a sensing capacitor of a capacitive voltage sensor, in which sensing capacitor the inner conductor is (Continued)

Figure 1:
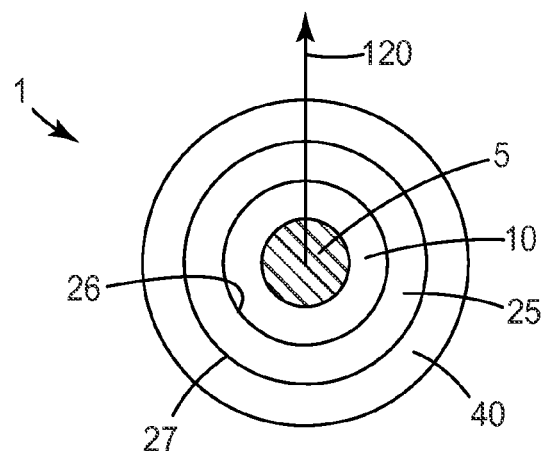

operable as a second electrode. The conductor assembly further includes an electrically insulating spacer element arranged radially between the insulating layer and the sensing electrode.

14 Claims, 3 Drawing Sheets

(51) Int. Cl.
*G01R 27/26* (2006.01)
*G01R 31/02* (2006.01)
*H01B 7/02* (2006.01)
*H01B 9/00* (2006.01)
*G01R 31/12* (2006.01)

(52) U.S. Cl.
CPC ............. *G01R 31/021* (2013.01); *H01B 7/02* (2013.01); *H01B 9/006* (2013.01); *G01R 27/26* (2013.01); *G01R 31/1272* (2013.01)

(58) Field of Classification Search
CPC .. G01R 31/086; G01R 31/1272; G01R 27/00; G01R 27/02; G01R 27/04; G01R 27/08; G01R 27/26; G01R 27/2605; G01R 15/16; G01R 19/0092; G01R 19/0084; G01D 5/24; G01D 5/2405; G01D 5/241; G01D 5/2412; G01D 5/2417; G06F 3/044; H01B 7/02; H01B 9/006
USPC ....... 324/600, 649, 658, 661, 662, 663, 686, 324/691, 713
See application file for complete search history.

(56) References Cited

U.S. PATENT DOCUMENTS

| | | | |
|---|---|---|---|
| 5,065,142 A | 11/1991 | Green | |
| 6,236,218 B1 | 5/2001 | Johansson | |
| 1,674,164 A1 | 10/2005 | Prunk et al. | |
| 1,642,710 A1 | 9/2006 | Bolcar | |
| 7,230,411 B2 | 6/2007 | Mulligan | |
| 7,479,878 B2 | 1/2009 | Maki | |
| 7,746,082 B2* | 6/2010 | Maruyama | G01R 31/1254 324/536 |
| 2014/0021965 A1* | 1/2014 | De Rybel | G01R 15/16 324/632 |
| 2014/0368221 A1* | 12/2014 | Weinmann | G01R 15/142 324/658 |
| 2016/0084888 A1* | 3/2016 | Busemann | G01R 19/0084 324/126 |

FOREIGN PATENT DOCUMENTS

| | | |
|---|---|---|
| EP | 2508808 | 10/2012 |
| GB | 1058890 | 2/1967 |
| JP | 60-256068 | 12/1985 |
| WO | WO 2014-120792 | 8/2014 |

OTHER PUBLICATIONS

Hobejogi, "Coaxial Capacitive Voltage Divider With High Division Ratio for High Voltage Pulses With Very Fast Rise Times", IEEE, Jun. 2011, pp. 313-318.
International Search Report for PCT International Application No. PCT/US2014/043126 mailed on Oct. 10, 2014, 4 pages.

* cited by examiner

CONDUCTOR ASSEMBLY

The invention relates to a conductor assembly, such as a cable, for power networks, that is equipped with a sensing electrode. It also relates to a high-voltage or medium-voltage power cable comprising such a conductor assembly, and to a power network comprising such a power cable.

Operators of electrical power networks monitor the state of their networks using sensors for voltage and current on their installations and on individual cables. An example of a voltage sensor for high-voltage and medium-voltage power cables is described in the British patent GB 1058890, in which the insulated conductor of the cable and a field-sensing probe electrode are surrounded by a guard electrode, and in which the guard and probe electrodes are connected to the input terminals of a high-gain amplifier.

In the German patent application DE 3702735 A1, a voltage measurement device for a cable comprises capacitive voltage divider. One of the capacitors, a high-voltage capacitor, is formed by the insulation of the central conductor of the cable and the conductive layer enveloping it. A measuring capacitor is located between the conductive layer and the shielding mesh of the cable.

The Japanese published patent application JP 60256068 A2 is related to measuring the charged voltage of a high-voltage power cable. It suggests to peel off a part of a shielding electrode of a power cable to expose an insulator. A conductive or semiconductive member is partially wound around the outer peripheral surface of the insulator to form a suspended electrode. A lead wire is embedded in and connected to said electrode.

Certain capacitive voltage dividers of voltage sensors, e.g. sensors on cables, comprise a sensing capacitor which is formed by the conductor of the cable as a first electrode, by the insulating layer of the cable as a dielectric, and by a conductive element on the insulating layer as a second electrode or "sensing electrode". In certain capacitive voltage dividers the sensing electrode is placed on the insulating layer of the cable. The material and structure of the insulating layer and the material and structure of the sensing electrode need to be compatible with each other in order to attain long-term stability of the sensor. Certain electrode materials may not be long-term compatible with certain insulating materials. Plasticizer may, for example, migrate from the insulating layer into a polymeric electrode material and degrade it over time. In other scenarios, the insulating layer may have a structured surface, so that when a rigid electrode is arranged on the insulating layer, air pockets exist between them, which may grow, when the cable gets hot, and which may shrink, when the cable cools down, so that long-term the electrode may be damaged. In a yet other scenario, the sensing electrode may be a conductive, self-adhesive foil, which is affixed to the insulating layer adhesively. The adhesive may not be compatible with the material of the insulating layer, so that, in the long term, the adhesion disappears and the electrode can move, or chemical components of the adhesive migrate into the insulating layer and change its chemical, mechanical and thus electrical properties.

Voltage sensors are normally calibrated when put into use. Long-term degradation effects of the insulating layer or of the sensing electrode or both, as described above, can result in a change of electrical properties of the sensing electrode or of the insulating layer, and can thus affect the electrical properties of the sensing capacitor over time. In other words, the electrical properties of the sensing capacitor may gradually deviate more and more from its properties during the initial calibration. This can lead to reduced measurement precision of the sensor over time and more and more incorrect sensing of the voltage of the cable conductor. Recalibration may either be difficult, because the sensors are not accessible any more, or too labour-intensive and costly. The present invention seeks to address such problems.

The present invention provides a conductor assembly for a power network, the conductor assembly comprising
- an inner conductor defining radial directions and axial directions,
- an insulating layer arranged around at least an axial section of the inner conductor, and
- a sensing electrode, arranged radially outward of the insulating layer, and operable as a first electrode of a sensing capacitor of a capacitive voltage sensor, in which sensing capacitor the inner conductor is operable as a second electrode, characterized by the conductor assembly further comprising
- an electrically insulating spacer element, arranged radially between the insulating layer and the sensing electrode.

The spacer element is arranged radially between the insulating layer and the sensing electrode, which is operable as a first electrode, i.e. a sensing electrode, of the sensing capacitor. The provision of a spacer element allows more flexibility in the selection of materials for the sensing electrode and for the insulating layer, respectively. The spacer element may be chosen such that materials can be used for the sensing electrode and for the insulating layer, respectively, that are not compatible with each other, but which are both compatible with the material of the spacer element. A suitably selected spacer element can thus reduce degradation of the insulating layer or of the sensing electrode and thereby render the sensing capacitor more stable over time. This may result in higher long-term accuracy of the voltage sensor and make recalibration of the voltage sensor obsolete.

As a further benefit, the geometry of the spacer element and/or its electrical properties may be chosen such that the capacitance of the sensing capacitor falls within a desired range, so that the voltage signal of the capacitive voltage sensor is within a desired range for a given voltage of the cable conductor.

Generally, a conductor assembly according to the invention may be suitable for carrying electrical power in a power network, e.g. for distribution of electrical power in a power network or a national grid. It may be suitable for carrying electrical power at current levels of 50 Ampere or higher, and at voltages of 10 kilovolt (kV) or higher. The inner conductor may be suitable for carrying the electrical power.

The insulating layer of a conductor assembly according to the invention is arranged around at least an axial section of the inner conductor. The insulating layer may be arranged concentrically around at least an axial section of the inner conductor. The insulating layer may be arranged on the inner conductor, in other words, it may be arranged radially outward of the inner conductor and in direct mechanical contact with the inner conductor. Alternatively, an intermediate layer may be arranged radially between the inner conductor and the insulating layer or portions of the insulating layer. In that case, the insulating layer can be said to be arranged around the inner conductor. It is not arranged on the inner conductor, in that case. An intermediate layer may, for example, be a conformable conductive layer. Such an intermediate layer helps to avoid air gaps or air pockets between the inner conductor and the insulating layer. This, in turn, reduces the risk of electrical partial discharges and subsequent damage to the conductor assembly.

The sensing electrode is operable as a first electrode of a sensing capacitor, in which sensing capacitor the inner conductor is operable as a second electrode. An electrically conductive element which is electrically connected to the inner conductor of the conductor assembly, i.e. a "conductor extension", may be operable as a second electrode. The insulating layer, or at least a portion of the insulating layer, of the conductor assembly may be operable as a dielectric of the sensing capacitor. More broadly, a dielectric of the sensing capacitor may comprise a portion of the insulating layer of the conductor assembly. The sensing capacitor may have a plurality of dielectrics. At least a portion of the spacer element of the conductor assembly may be operable as a further dielectric of the sensing capacitor. Generally, the sensing capacitor may be a sensing capacitor of a voltage sensor. The voltage sensor may be comprised in the conductor assembly. The voltage sensor may be suitable for sensing a voltage of the inner conductor, e.g. relative to electrical ground or relative to another electrical potential. Generally, the voltage sensor may be a capacitive voltage sensor.

The voltage sensor may be a capacitive voltage dividing sensor, which comprises a first and a second dividing capacitor. The first and the second dividing capacitors may be electrically connected in series. The sensing capacitor may be the first dividing capacitor.

In certain embodiments of the invention, the inner conductor of the conductor assembly may comprise at least a portion of an inner conductor of a high-voltage or medium-voltage power cable. In certain embodiments, the insulating layer of the conductor assembly may comprise at least a portion of an insulating layer of a high-voltage or medium-voltage power cable. In certain embodiments, the inner conductor of the conductor assembly may comprise at least a portion of an inner conductor of a high-voltage or medium-voltage power cable and the insulating layer of the conductor assembly may comprise at least a portion of an insulating layer of the high-voltage or medium-voltage power cable. An insulated high-voltage or medium-voltage power cable may be a cost-effective, easily available means to manufacture a conductor assembly that has a voltage sensing function.

Generally, the spacer element may be arranged on the insulating layer, in other words, it may be arranged radially outward of the insulating layer and in direct mechanical contact with the insulating layer. An arrangement on the insulating layer eliminates electrical influence of intermediate layers. It is, for example, desirable to know the dielectric properties of the material(s) forming a dielectric of the sensing capacitor, i.e. of the materials arranged between the sensing electrode and the inner conductor. Knowledge of such properties may facilitate calibration of the voltage sensor. Arrangement of the spacer element on the insulating layer may avoid introduction of uncertainties caused by additional layers, and thereby potentially increases the accuracy of the voltage sensing. Also, this arrangement may result in the conductor assembly having a smaller outer diameter.

Generally, the sensing electrode may be, or it may comprise, a piece or a patch or a layer of conductive or semiconductive material. The sensing electrode may be electrically isolated, i.e. electrically isolated from other elements of the conductor assembly, e.g. from the inner conductor, and/or from a shielding layer. The sensing electrode may be electrically isolated, i.e. electrically isolated from other elements of the conductor assembly except for an electrical connection for making a signal of the sensing electrode available at a location remote from the sensing electrode.

Generally, the sensing electrode may be arranged on the spacer element, i.e. radially outward of the spacer element and in direct mechanical contact with the spacer element. As described in the previous paragraphs, arrangement of the sensing electrode on the spacer element may help in eliminating electrical influence of intermediate layers and thereby in increasing the accuracy of the voltage sensing. Also, this arrangement may result in the conductor assembly having a smaller outer diameter.

Generally, the spacer element may comprise, for example, silicone, rubber, and/or EPDM (ethylene propylene diene monomer). These materials provide good electrical insulation and are long-term compatible with many materials typically used for the insulating layer of the cable and with many materials typically used for sensing electrodes.

The spacer element may comprise a spacer layer having a first and an opposed second major surface. The first major surface of the spacer layer may be arranged on the insulating layer. Generally, a spacer layer may be arranged on the insulating layer, i.e. radially outward of the insulating layer and with its first major surface being in direct contact with the insulating layer.

Generally, the sensing electrode may be arranged on the spacer layer, i.e. radially outward of the spacer layer and in direct contact with the second major surface of the spacer layer. The sensing electrode may be arranged on the second major surface of the spacer layer. Generally, the spacer element may comprise one, two, or more spacer layers. A spacer element in the form of a layer may be particularly easy and cost-effective to obtain and to apply, when compared to a spacer element having a different shape, because tapes, films and foils of suitable properties are widely available. A spacer layer may be more homogenous in its electrical and mechanical properties than a spacer element having a different shape. A spacer layer may allow to keep the outer dimensions of the conductor assembly small. Since the spacer element is arranged between the insulating layer of the conductor assembly and the sensing electrode, it may be operable as a part of a dielectric of the sensing capacitor. A homogenous spacer element or spacer layer may therefore result in higher sensing accuracy of the voltage sensor. A spacer element in the form of a spacer layer, e.g. a tape or an adhesive tape, may be particularly easy to store before being integrated into a conductor assembly according to the invention. A spacer layer may have a continuous or flat surface or it may have recesses, protrusions or openings.

The spacer element may be solid. Generally, a spacer element may be rigid. In combination with certain types of insulating layers, a rigid spacer element may increase the accuracy of the voltage sensing, because the spacer element maintains its geometric properties under moderate forces. This may keep the geometric distance between the electrodes of the sensing capacitor—the inner conductor and the sensing electrode—constant under moderate forces, and may thereby maintain the calibration of the sensor better, which may result in a higher voltage sensing accuracy. Specifically, the spacer element may comprise a portion having a radial thickness of between about 1 millimeter and about 10 millimeters. If the spacer element comprises a spacer layer, the spacer layer may comprise a portion having a radial thickness of between about 1 millimeter and about 10 millimeters.

An inner conductor of a conductor assembly according to the invention may be elongated. In that case, its long extension defines the axial directions, and directions perpendicular thereto are radial directions. An insulating layer of a conductor assembly according to the invention may be rotationally symmetric with respect to a longitudinal central axis of the inner conductor. Such an insulating layer has a circumference. The spacer layer may extend around a full circumference of the insulating layer. In such an arrangement, the spacer layer may be particularly easy and cost-effective to apply around the insulating layer. Also, such an arrangement may maintain the rotational symmetry of the conductor assembly, which may make the conductor assembly easier to handle or more space-saving to store. Alternatively, the spacer layer may extend around a first portion of the circumference of the insulating layer and not around a second portion of the circumference of the insulating layer. Such an arrangement is potentially space-saving.

The spacer element may have the same extension, in axial and/or circumferential directions, as the sensing electrode. The spacer element and the sensing electrode may be co-extensive. Alternatively, the spacer element may have a larger extension, in axial and/or circumferential directions, than the sensing electrode.

The spacer element is electrically insulating. In the context of this invention, this means that the specific resistance of the spacer element is higher than $10^{12}$ Ohm cm.

The sensing electrode is operable as the first electrode of the sensing capacitor. The sensing capacitor may be a first dividing capacitor in a capacitive voltage divider. The capacitive voltage divider may be suitable for sensing the voltage of the inner conductor. In order to sense the voltage, the sensing electrode may be connectable to other electric or electronic components, so that a voltage signal of the first electrode is made available to those other components for sensing the voltage of the inner conductor. A wire, attached to the sensing electrode, may be used to lead the voltage signal of the sensing electrode to those other components. Depending on the properties of a sensing electrode or of a wire, it may be difficult to attach a wire directly to the sensing electrode. An electrically conductive voltage pickup element may be arranged such as to be in an extended mechanical and electrical surface contact with the sensing electrode. The voltage pickup element may be adapted such that a wire can be connected to it, which wire leads the voltage signal from the sensing electrode to the other electric or electronic components. The voltage pickup element may, for example, be an electrically conductive foil or film, or a metallized foil or film or a metal sheet or, generally, an element comprising a metal surface or a metallized surface.

Alternatively, the voltage pickup element may be a circuit board having an extended exposed conductive region, which region forms an electrical contact adapted to form an extended mechanical and electrical surface contact with the sensing electrode, such that the voltage signal of the sensing electrode, is available on the circuit board. The circuit board may support one or more electric or electronic components. Those components may be suitable for sensing the voltage of the inner conductor, using the voltage signal of the first electrode.

Generally, a voltage pickup element can establish electrical contact to the sensing electrode in several locations. It thereby picks up the voltage from the sensing electrode. Electrical contact in several locations may avoid the disadvantages of having electrical contact only in one location on the sensing electrode, namely it avoids, firstly, problems resulting from a bad electrical contact in the one location, if that one contact is, e.g., incomplete, corroded, or damaged. In the case of corrosion or damage, no voltage or a lower voltage can be measured on the voltage pickup element, resulting in an incorrect voltage reading of the sensor. Secondly, it also avoids problems arising from the fact that electrons travelling from a rim of the sensing electrode to the one contact location experience the electrical resistance of the sensing electrode over a longer path. This, in turn, may lead to a voltage drop and eventually to a less accurate voltage being measured.

In contrast, a conductor assembly according to the invention, having a voltage pickup element, may provide a large number of contact points on various locations on the voltage pickup element, and thereby on various locations on the sensing electrode. This creates redundancy, so that a single corroded, incomplete or damaged contact point cannot lead to an erroneous measurement of the voltage. Also, a large number of contact points will shorten the path which electrons have to travel from a rim of the sensing electrode to the next closest contact location on the voltage pickup element. This may result in a much smaller voltage drop and a higher accuracy of the voltage reading. The voltage pickup element may be electrically connectable to a circuit board, e.g. by a wire. If the voltage sensor is arranged in a closure, the circuit board may be arranged in the same closure as the voltage sensor. If the voltage sensor is covered by a sleeve, the circuit board may be covered by the same sleeve as the voltage sensor. Alternatively, the voltage pickup element may itself be a circuit board. In particular, it may be a circuit board which comprises an exposed conductive region which provides an extended two-dimensional surface contact area. The exposed conductive region may be in mechanical and electrical contact with the sensing electrode in two dimensions and over an extended area.

In certain embodiments of the invention, the sensing electrode is comprised in a cable accessory device, a cable splice body, or a cable termination body. In certain embodiments, also the spacer element is comprised in the cable accessory device, the cable splice body, or the cable termination body. A cable accessory device, a cable splice body, or a cable termination body may be called a cable accessory element. Hence, a cable accessory element may comprise the sensing electrode or the spacer element or both. The invention also provides a combination of a cable accessory element, which comprises a spacer element and a sensing electrode arranged radially outward of the spacer element, and a medium-voltage or high-voltage power cable, which comprises an inner conductor and an insulating layer arranged around at least an axial section of the inner conductor, wherein the cable accessory element and the power cable are arranged such as to form a conductor assembly according to the invention. Specifically, they may be arranged such as to form a conductor assembly for a power network, the conductor assembly comprising an inner conductor defining radial directions and axial directions, an insulating layer arranged around at least an axial section of the inner conductor, and a sensing electrode, arranged radially outward of the insulating layer, and operable as a first electrode of a sensing capacitor of a capacitive voltage sensor, in which sensing capacitor the inner conductor is operable as a second electrode, and an electrically insulating spacer element, arranged radially between the insulating layer and the sensing electrode.

The invention will now be described in more detail with reference to the following Figures exemplifying particular embodiments of the invention. The Figures are not to scale, and some dimensions, in particular some thicknesses of layers, are exaggerated for greater clarity.

Figure 2:
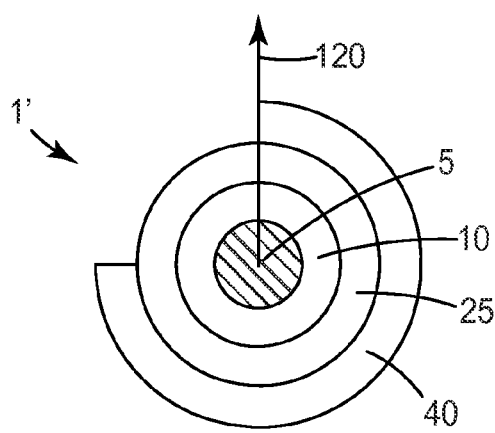
Figure 3:
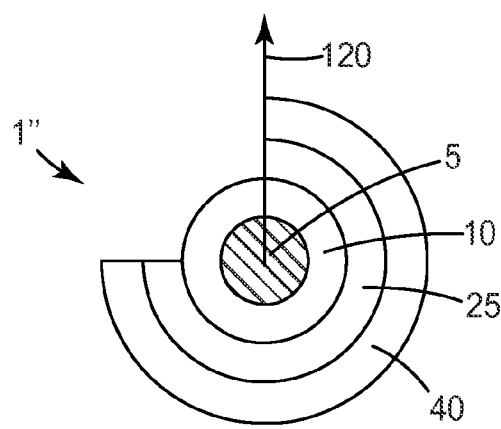
Figure 4:
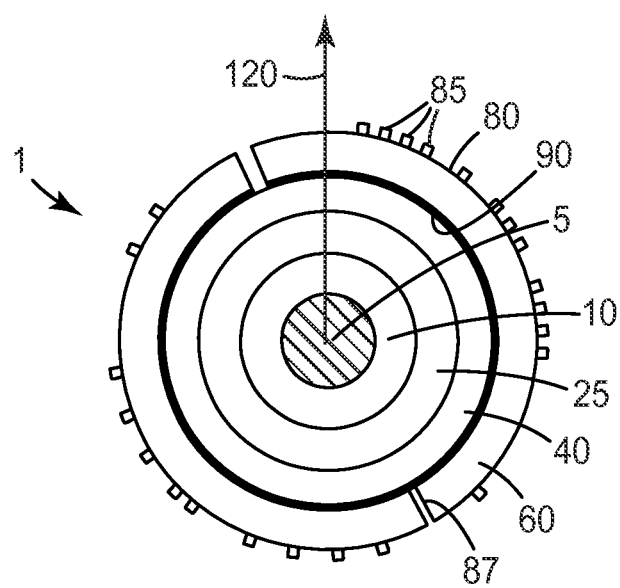
Figure 5:
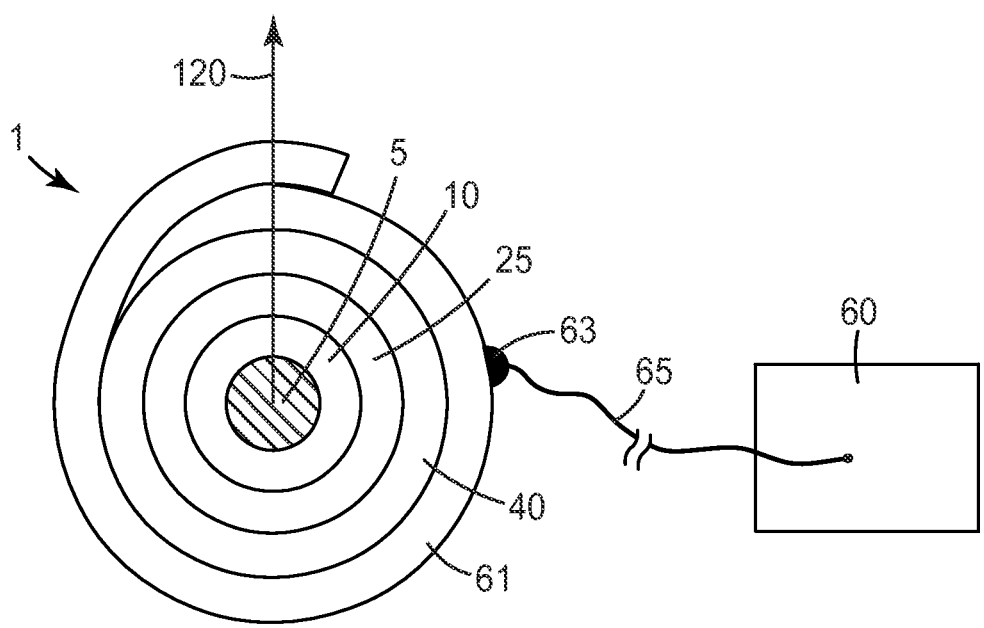
Figure 6:
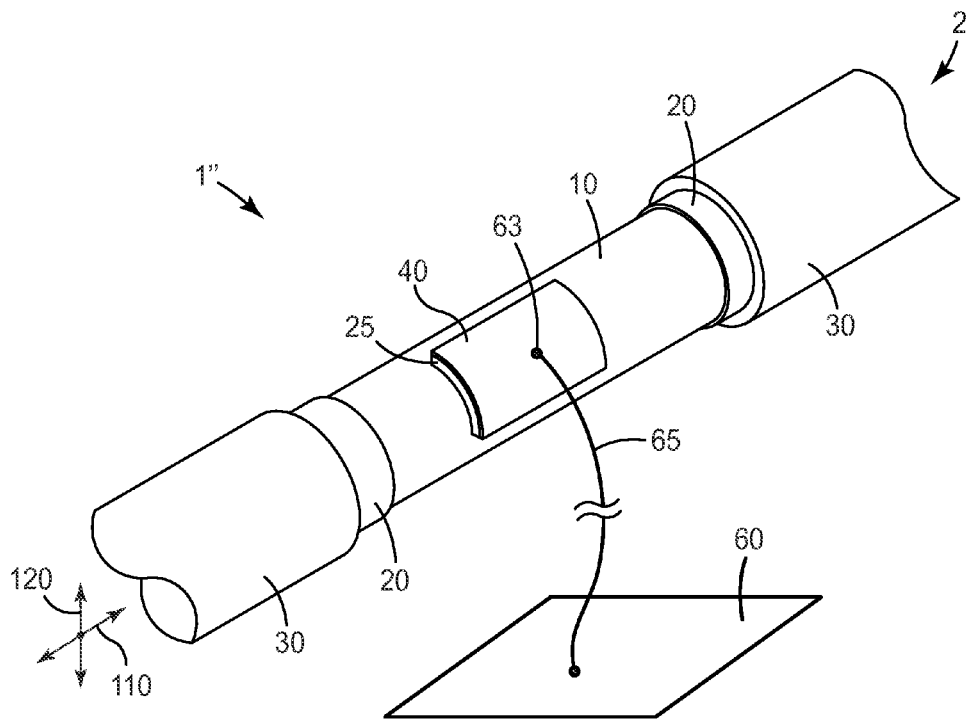
Figure 7:
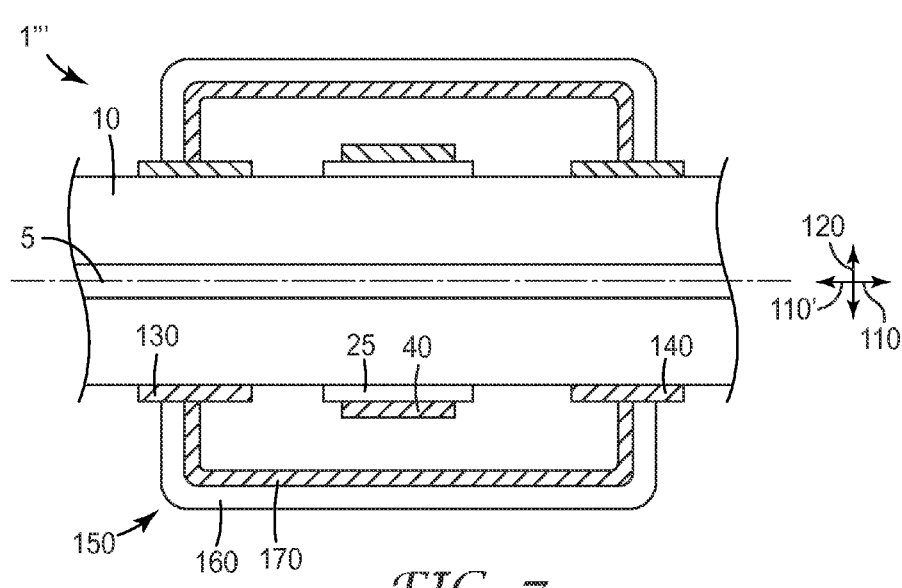

FIG. 1 Schematic cross section of a first conductor assembly according to the invention;

FIG. 2 Schematic cross section of a second conductor assembly according to the invention;

FIG. 3 Schematic cross section of a third conductor assembly according to the invention;

FIG. 4 Schematic cross section of the first conductor assembly, with a wrapped circuit board;

FIG. 5 Schematic cross section of the first conductor assembly, with a remote circuit board; and FIG. 6 Sketched perspective view of the third conductor assembly according to the invention;

FIG. 7 Schematic longitudinal section of a fourth conductor assembly according to the invention, with a housing.

Herein below various embodiments of the present invention are described and shown in the drawings wherein like elements are provided with the same reference numbers.

FIG. 1 is a schematic cross section of a first conductor assembly 1 according to the invention. An insulating layer 10 is arranged concentrically on an inner conductor 5 of circular cross section. The conductor 5 is elongated and extends longitudinally perpendicular to the plane of the drawing, defining radial and axial directions. A radial direction 120, pointing away from the center of the inner conductor 5, is indicated by arrow 120, axial directions are perpendicular to the plane of the drawing. An electrically insulating spacer element is arranged on the insulating layer 10. In the embodiment shown in FIG. 1, the spacer element is a spacer layer 25, made of electrically insulating silicone. The spacer layer 25 has a first major surface 26 and a second, opposed major surface 27. The first major surface 26 is arranged on the insulating layer 10. A layer 40 of conductive material is arranged on the second major surface 27. The layer 40 of conductive material is a sensing electrode 40. The spacer layer 25 extends around the full circumference of the insulating layer 10. The layer 40 of conductive material extends around the full circumference of the spacer layer 25. The layer 40 of conductive material and the inner conductor 5 are operable as electrodes of a sensing capacitor, with the insulating layer 10, arranged between the electrodes, being operable as a dielectric of the sensing capacitor. Also the spacer layer 25 is operable as a dielectric of the sensing capacitor, because it is also arranged between the electrodes of the sensing capacitor. The spacer layer 25 keeps the layer 40 of conductive material at a distance from the outer surface of the insulating layer 10.

The inner conductor 5 and the insulating layer 10 are comprised in a high-voltage power cable. That cable comprises further layers (not shown) at a distance from the area where the cross section is taken, namely a semiconductive layer arranged on the insulating layer 10, a shielding braid layer arranged on the semiconductive layer, and a cable sheath arranged around the shielding braid layer. In the axial section where the layer 40 of conductive material is arranged on the insulating layer 10, outer layers of the cable have been removed such as to expose the insulating layer 10. After this "stripping", the spacer layer 25 is applied on the insulating layer 10, and the layer 40 of conductive material is applied on the spacer layer 25.

The sensing capacitor is operated as a first dividing capacitor of a capacitive voltage dividing voltage sensor for sensing a voltage of the inner conductor 5. For sensing the voltage of the inner conductor 5, a wire (not shown) is attached to the layer 40 of conductive material and led to a PCB, where it is connected to a capacitor, a second dividing capacitor, which is connected to electrical ground. The first dividing capacitor, formed by the conductor 5 and the layer 40 of conductive material, and the second dividing capacitor form a capacitive voltage divider, which allows to sense the voltage of the inner conductor 5 relative to electrical ground.

FIG. 2 is a schematic cross section of a second conductor assembly 1' according to the invention. It is similar to the first conductor assembly 1, except for the layer 40 of conductive material extending around the spacer element 25 only for a portion, about three quarters, of the circumference of the spacer element 25. In other embodiments, the layer 40 of conductive material can extend for any portion of the circumference of the spacer element 25, like half, a third, two thirds of the circumference, the circumferential extension is not essential. In spite of its smaller circumferential extension, compared to FIG. 1, the layer 40 of conductive material is operable as a first electrode of a sensing capacitor of a capacitive voltage divider for sensing the voltage of the inner conductor 5. The sensing capacitor further comprises the inner conductor 5 as a second electrode, and as a dielectric a portion of the insulating layer 10 located between the layer 40 of conductive material and the inner conductor 5. The sensing capacitor comprises as a further dielectric a portion of the spacer element 25 which is located between the layer 40 of conductive material and the inner conductor 5.

FIG. 3 is a schematic cross section of a third conductor assembly 1" according to the invention. It is similar to the second conductor assembly 1', except for the spacer element 25 extending around the insulating layer 10 only for a portion, namely about three quarters, of the circumference of the insulating layer 10. In this third conductor assembly 1", the spacer element 25 and the sensing electrode 40, i.e. the layer 40 of conductive material, are coextensive in the cross section, and extend for about three quarters of the circumference of the insulating layer 10.

FIG. 4 is another schematic cross section of the first conductor assembly 1, further comprising a circuit board 60. The circuit board 60 is a flexible printed circuit board, wrapped around the layer 40 of conductive material. The circuit board 60 is thin and has a first major surface 80, on which electric and electronic components 85 are mounted. The circuit board 60 has an opposed second major surface, which comprises an extended conductive region 90. The extended conductive region 90 forms an extended electrical contact. It forms an extended mechanical and electrical surface contact with the layer 40 of conductive material, such that the voltage signal of the first electrode, i.e. of the layer 40 of conductive material, is available on the circuit board 60. For that purpose, the circuit board 60 is wrapped around the layer 40 of conductive material such that the extended conductive region 90 on the second surface electrically and mechanically contacts intimately the radially outer surface of the layer 40 of conductive material. The circuit board 60 extends around almost the entire circumference of the layer 40 of conductive material. The large contact area between the circuit board 60 and the layer 40 of conductive material provides for small resistive losses for currents between these elements, and thus a high accuracy of the voltage sensing. A via 87, i.e. an electrical connection between the extended conductive region 90 on the second surface and conductive traces on the first surface 80 of the circuit board 60, makes the voltage picked up by the extended conductive region 90 from the layer 40 of conductive material available on the first surface 80 of the circuit board 60.

The circuit board 60 shown in FIG. 4 is flexible. Alternatively, the circuit board may be a rigid circuit board, shaped such that its extended conductive region 90 forms an extended electrical contact with the layer 40 of conductive material.

One of the electronic components 85 on the first surface 80 of the circuit board 60 is a capacitor, which is electrically connected with the layer 40 of conductive material via the extended conductive region 90. This capacitor is a second dividing capacitor in a capacitive voltage dividing sensor for sensing the voltage of the inner conductor 5. The sensing capacitor, formed by the layer 40 of conductive material and the inner conductor 5, is the first dividing capacitor in this capacitive voltage dividing sensor. The sensor can thereby sense the voltage of the inner conductor versus electrical ground.

FIG. 5 is a further schematic cross section of the first conductor assembly 1. It is similar to the assembly shown in FIG. 4, except that the circuit board 60 is remote from the sensing electrode 40, i.e. from the layer 40 of conductive material. A voltage pickup element 61 is wrapped around the layer 40 of conductive material in order to pick up the voltage signal from the layer 40 of conductive material. The voltage pickup element 61 is an electrically conductive metal foil. It provides a large and extended mechanical and electrical surface contact with the layer 40 of conductive material, such that the voltage signal of the first electrode 40, i.e. of the layer 40 of conductive material, is available on the voltage pickup element 61. A wire 65 is soldered to a contact point 63 on the voltage pickup element 61. This wire 65 leads the voltage signal of the first electrode 40 to the remote circuit board 60, where the second dividing capacitor (not shown) is arranged. While a circuit board 60, remote or not, provides a convenient way to support electric and electronic components and in particular the second dividing capacitor, the arrangement of the second dividing capacitor on a circuit board 60 is not essential, and the second dividing capacitor may be arranged alternatively as an isolated component or on some other support structure.

FIG. 6 is a sketched perspective view of the third conductor assembly 1" of FIG. 3. The conductor assembly 1" comprises a high-voltage power cable 2. The cable 2 comprises the insulating layer 10, concentrically arranged around the inner conductor 5 (not visible). The conductor 5 defines radial directions 120 and axial directions 110 indicated by a double arrow. A semiconductive layer 20 is arranged concentrically around the insulating layer 10, and an electrically insulating cable sheath 30 is arranged around the semiconductive layer 20. In an axial section, the cable 2 is stripped, i.e. the cable sheath 30 and the semiconductive layer 20 are removed, so that the insulating layer 10 is exposed. In the stripped section, an electrically insulating spacer element 25 is arranged on the insulating layer 10, and the electrically isolated layer 40 of conductive material is arranged on the spacer element 25, so that the spacer element 25 is arranged radially between the insulating layer 10 and the layer 40 of conductive material. The cross section of FIG. 3 is taken in the stripped section, in the area where the spacer element 25 and the layer 40 of conductive material are arranged.

A wire 65 is attached directly to the layer 40 of conductive material at a connection point 63. The wire 65 conducts the voltage signal of the layer 40 of conductive material to a remotely located PCB 60, on which the second dividing capacitor (not shown) of the capacitive voltage dividing sensor is arranged.

FIG. 7 is a schematic longitudinal section of a further, fourth conductor assembly 1''' according to the invention. It is similar to the previously described conductor assemblies 1, 1', 1". The conductor assembly 1''' comprises an inner conductor 5 and an insulating layer 10 arranged around the inner conductor 5. A sensing electrode 40 is arranged on a spacer element 25.

Two auxiliary electrodes, a first auxiliary electrode 130 and a second auxiliary electrode 140, are arranged on the insulating layer 10, on opposite sides of the sensing electrode 40, in the longitudinal section. The first auxiliary electrode 130 is arranged axially spaced from the sensing electrode 40 in a first axial direction 110', the second auxiliary electrode 140 is arranged axially spaced from the sensing electrode 40 in an axial direction 110 opposite to the first axial direction 110'. The auxiliary electrodes 130, 140 are on electrical ground. They reduce inhomogenities of the electrical field created by the inner conductor 5 in the vicinity of the sensing electrode 40. A more homogenous electrical field increases the accuracy of the voltage sensing of the sensing electrode 40, as described above for the other conductor assemblies 1, 1', 1" according to the invention.

The sensing electrode 40 is arranged inside a housing 150, which is arranged coaxially around the conductor assembly 1'''. The housing 150 has an electrically insulating outer shell 160 and an electrically conductive lining 170, arranged on the inside of the outer shell 160. The outer shell 160 and the lining 170 are arranged such that the lining 170 electrically and mechanically contacts the first auxiliary electrode 130 and the second auxiliary electrode 140, thereby establishing an electrical connection between the first auxiliary electrode 130 and the second auxiliary electrode 140. In other words, the conductive lining 170 electrically connects the first auxiliary electrode 130 and the second auxiliary electrode 140 with each other. This makes a separate electrical connection between the first auxiliary electrode 130 and the second auxiliary electrode 140, e.g. by a wire, obsolete. Also, the lining 170 forms a Faraday cage around the sensing electrode 40 and provides shielding between the sensing electrode 40 and electrical fields outside of the housing 150.

The conductive lining 170 can be formed, for example, by an electrically conductive paint, or generally by an electrically conductive coating, applied to the inside of the shell 160, or by a molded conductive layer arranged on the inside of the shell 160.

As an alternative, the conductive lining 170, such as a conductive paint, may arranged on the outer surface of the shell 160. It can be arranged such as to electrically contact the auxiliary electrodes 130, 140 and electrically connect them with each other.

Alternatively, the housing 150 comprising the shell 160 and the lining 170 can be formed by an elastic tube, which comprises an outer layer which is electrically insulating, corresponding to the outer shell 160 of the housing 150. The tube can comprise an electrically conductive inner layer, corresponding to the lining 170. The tube can be arranged such that the conductive inner layer electrically contacts the auxiliary electrodes 130, 140, and electrically connects them with each other. The tube may have a further insulating layer, arranged inward from the conductive layer. This further insulating layer may be arranged such as to prevent electrical contact between the conductive layer and the sensing electrode 40. The tube may comprise, for example, a shrinkable sleeve. The tube may be comprised in a cable accessory device, e.g. a cable splice body or a cable termination body.

The invention claimed is:

1. Conductor assembly for a power network, the conductor assembly comprising
    an inner conductor defining radial directions and axial directions,
    an insulating layer arranged around at least an axial section of the inner conductor, and
    a sensing electrode, arranged radially outward of the insulating layer, and operable as a first electrode of a sensing capacitor of a capacitive voltage sensor, in which sensing capacitor the inner conductor is operable as a second electrode,
    the conductor assembly further comprising an electrically insulating spacer element, arranged radially between the insulating layer and the sensing electrode,
    wherein the spacer layer is selected such that the capacitance of the sensing capacitor falls within a desired range for a given voltage of the cable conductor,
    wherein the spacer element comprises a silicone, a rubber or an ethylene propylene diene monomer.

2. Conductor assembly according to claim 1, wherein the spacer element is arranged on the insulating layer.

3. Conductor assembly according to claim 1, wherein the sensing electrode is arranged on the spacer element.

4. High-voltage or medium-voltage power cable comprising a conductor assembly according to claim 1.

5. Conductor assembly according to claim 1, wherein the spacer element comprises a spacer layer having a first and an opposed second major surface.

6. Conductor assembly according to claim 5, wherein the first major surface of the spacer layer is arranged on the insulating layer.

7. Conductor assembly according to claim 5, wherein the sensing electrode is arranged on the second major surface of the spacer layer.

8. Conductor assembly according to claim 1, wherein the spacer element comprises a portion having a radial thickness of between 1 millimeter and 10 millimeters.

9. Conductor assembly according to claim 1, wherein the insulating layer has a circumference, and wherein the spacer layer extends around a full circumference of the insulating layer.

10. Conductor assembly according to claim 1, wherein the inner conductor of the conductor assembly comprises at least a portion of an inner conductor of a high-voltage or medium-voltage power cable, and wherein the insulating layer of the conductor assembly comprises at least a portion of an insulating layer of the high-voltage or medium-voltage power cable.

11. Conductor assembly according to claim 1, wherein the sensing electrode is comprised in a cable accessory device, a cable splice body, or a cable termination body.

12. Conductor assembly according to claim 1, wherein the sensing electrode comprises a layer of conductive or semi-conductive material.

13. Conductor assembly according to claim 1, comprising an electrically conductive voltage pickup element, arranged such as to be in an extended mechanical and electrical surface contact with the sensing electrode.

14. Power network comprising a high-voltage or medium-voltage power cable according to claim 4.

* * * * *

UNITED STATES PATENT AND TRADEMARK OFFICE
CERTIFICATE OF CORRECTION

PATENT NO. : 9,739,805 B2  
APPLICATION NO. : 14/897688  
DATED : August 22, 2017  
INVENTOR(S) : Mark Gravermann et al.

Page 1 of 1

It is certified that error appears in the above-identified patent and that said Letters Patent is hereby corrected as shown below:

On the Title Page

Item (72), (Inventors):
Line 7, Delete "Jedem" and insert -- Uedem --, therefor.

Signed and Sealed this
Twentieth Day of March, 2018

Andrei Iancu
*Director of the United States Patent and Trademark Office*